United States Patent
Yasui et al.

(10) Patent No.: US 10,703,863 B2
(45) Date of Patent: Jul. 7, 2020

(54) POLYMERIZABLE COMPOSITION COMPRISING SILSESQUIOXANE COMPOUND HAVING ACRYLIC GROUP

(71) Applicant: NISSAN CHEMICAL INDUSTRIES, LTD., Tokyo (JP)

(72) Inventors: Kei Yasui, Funabashi (JP); Takehiro Nagasawa, Funabashi (JP); Taku Kato, Funabashi (JP); Keisuke Shuto, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 5 days.

(21) Appl. No.: 15/757,628

(22) PCT Filed: Sep. 1, 2016

(86) PCT No.: PCT/JP2016/075699
§ 371 (c)(1),
(2) Date: Mar. 5, 2018

(87) PCT Pub. No.: WO2017/038943
PCT Pub. Date: Mar. 9, 2017

(65) Prior Publication Data
US 2018/0244852 A1    Aug. 30, 2018

(30) Foreign Application Priority Data

Sep. 2, 2015  (JP) ................. 2015-173351

(51) Int. Cl.
| | | |
|---|---|---|
| C08G 77/20 | (2006.01) |
| C08F 230/08 | (2006.01) |
| C08F 290/06 | (2006.01) |
| C08F 220/30 | (2006.01) |
| G02B 3/00 | (2006.01) |
| G02B 1/04 | (2006.01) |
| C08G 77/04 | (2006.01) |
| C08G 77/00 | (2006.01) |
| B29D 11/00 | (2006.01) |
| H01L 27/146 | (2006.01) |
| C08F 222/10 | (2006.01) |
| C08F 2/48 | (2006.01) |
| B29K 83/00 | (2006.01) |

(52) U.S. Cl.
CPC ........ *C08G 77/20* (2013.01); *B29D 11/00442* (2013.01); *C08F 220/30* (2013.01); *C08F 230/08* (2013.01); *C08F 290/06* (2013.01); *C08G 77/045* (2013.01); *C08G 77/80* (2013.01); *G02B 1/04* (2013.01); *G02B 1/041* (2013.01); *G02B 3/00* (2013.01); *H01L 27/14643* (2013.01); *B29K 2083/00* (2013.01); *C08F 2/48* (2013.01); *C08F 222/1006* (2013.01)

(58) Field of Classification Search
CPC . C08G 77/20; C08F 230/08; B29D 11/00442; G02B 1/041
See application file for complete search history.

(56) References Cited

U.S. PATENT DOCUMENTS

| | | | |
|---|---|---|---|
| 2007/0225466 A1* | 9/2007 | Matsumoto | C08L 83/14 528/25 |
| 2010/0209669 A1 | 8/2010 | Aoai et al. | |
| 2013/0116362 A1* | 5/2013 | Yamazaki | C08F 2/44 523/458 |

FOREIGN PATENT DOCUMENTS

| | | |
|---|---|---|
| EP | 2 221 326 A1 | 8/2010 |
| JP | H09-31136 A | 2/1997 |
| JP | H10-161315 A | 6/1998 |
| JP | 2008-088430 A | 4/2008 |
| JP | 2008-297490 A | 12/2008 |
| JP | 2011-006610 A | 1/2011 |
| JP | 2011006610 * | 1/2011 |
| JP | 2012-062398 A | 3/2012 |
| JP | 2012-180462 A | 9/2012 |
| JP | 2013-221112 A | 10/2013 |
| WO | 2013/094585 A1 | 6/2013 |
| WO | 2015/022965 A1 | 2/2015 |
| WO | 2015/129818 A1 | 9/2015 |

OTHER PUBLICATIONS

JP 2011 006610 machine translation (2011).*
Nov. 22, 2016 Search Report issued in International Patent Application No. PCT/JP2016/075699.
Nov. 22, 2016 Written Opinion issued in International Patent Application No. PCT/JP2016/075699.
May 27, 2019 Extended European Search Report issued in European Patent Application No. 16841972.9.

* cited by examiner

*Primary Examiner* — Kuo Liang Peng
(74) *Attorney, Agent, or Firm* — Oliff PLC

(57) ABSTRACT

There is provided a polymerizable composition suitable to produce a molded product in which high refractive index is maintained, and dimensional change and a transmittance change further caused by a high-temperature heat history can be suppressed. A polymerizable composition comprising (a) 100 parts by mass of a specific reactive silsesquioxane compound and (b) 10 to 2,000 parts by mass of a specific fluorene compound, and a cured product obtained by curing the polymerizable composition, and a resin lens manufactured from the polymerizable composition.

12 Claims, No Drawings

POLYMERIZABLE COMPOSITION COMPRISING SILSESQUIOXANE COMPOUND HAVING ACRYLIC GROUP

TECHNICAL FIELD

The present invention relates to a polymerizable composition comprising a reactive silsesquioxane compound having an acrylic group. In particular, the present invention relates to a polymerizable composition capable of forming a cured product having excellent optical characteristics (high refractive index) and high heat resistance (dimensional stability, transparency, etc.).

BACKGROUND ART

A plastic lens has been used for various types of optical devices. The plastic lens is required to have excellent optical characteristics depending on purposes of the devices. Further, the plastic lens is required to have high durability, such as heat resistance and weather resistance, and high productivity for molding with high yield according to a use aspect.

As a resin material for the plastic lens, for example, a transparent resin such as a polycarbonate resin, a cycloolefin polymer, an acrylic resin, or a methacrylic resin has been used (Patent Documents 1 and 2).

The plastic lens is used, for example, for a CMOS image sensor or a CCD image sensor that is used for a variety of devices such as a cellular phone, a digital camera, an in-vehicle camera, a surveillance camera, and a security camera. In the image sensors, a decrease in amount of concentrated light per pixel due to microfabrication is prevented by placing a micro lens. For such a lens, a material having transparency and high refractive index is required to improve the light extraction efficiency and light concentrating properties.

In consideration of severe usage environment of an in-vehicle camera and the like, the material is also required to have heat resistance.

In recent years, attention is attracted to a wearable terminal capable of being worn that is new use of the CMOS image sensor.

When for the new use, the image sensor is incorporated into a device or the like, further miniaturization and a reduction in weight and cost are required for the image sensor. Therefore, in the plastic lens used in the image sensor for such a new use, it is desirable that a basic performance such as the transparency, refractive index, and heat resistance is improved to achieve the miniaturization above mentioned and the like of the image sensor. Further, it is desirable to achieve a simple manufacturing process and a reduction in cost as compared with conventional manufacturing using injection molding.

PRIOR ART DOCUMENTS

Patent Documents

Patent Document 1: Japanese Patent Application Publication No. H09-31136 (JP H09-31136 A)
Patent Document 2: Japanese Patent Application Publication No. 2012-62398 (JP 2012-62398 A)

SUMMARY OF THE INVENTION

Problem to be Solved by the Invention

For the lens for the CMOS image sensor mounted in the wearable terminal or the like, a curable resin material having a high refractive index (e.g., 1.57 or more), high transparency (e.g., a light transmittance of 95% or more at 400 nm), dimensional stability for temperature change that corresponds to suitable heat resistance even in the severe usage environment (e.g., a dimensional change ratio after 500 hours at 125° C. of 2% or less), and light transmittance stability (e.g., a decrease ratio of light transmittance at 400 nm after 500 hours at 150° C. of 1% or less) has not yet been found. The development of such a curable resin material has been desired.

Further, a curable resin material that has the aforementioned properties and can be applied to a manufacturing method capable of achieving a simple process and a reduction in cost as compared with a conventional manufacturing method using injection molding or the like has not yet been proposed.

In view of the circumstances, the present invention was made. An object of the present invention is to provide a polymerizable composition suitable to produce a molded product in which high refractive index and transparency are maintained in a cured product and dimensional change and a decrease in transmittance caused by a high-temperature heat history can be suppressed.

Means for Solving the Problems

In order to solve the above-described problems, the present inventors have intensively investigated, and as a result, found that when a specific fluorene compound is added to a polymerizable composition in addition to a specific reactive silsesquioxane compound, a cured product (molded product) to be obtained expresses a high refractive index and high transparency, and a molded product capable of suppressing dimensional change and a reduction in transmittance caused by a high-temperature heat history is obtained. Thus, the present invention has been completed.

Specifically, a first aspect of the present invention relates to a polymerizable composition comprising (a) 100 parts by mass of reactive silsesquioxane compound as a polycondensate of an alkoxy silicon compound A of Formula [1] with an alkoxy silicon compound B of Formula [2] in an amount by mole of 0 to 99 times the amount of the alkoxy silicon compound A, and (b) 10 to 2,000 parts by mass of fluorene compound of Formula [3].

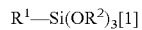

(wherein $R^1$ is a $C_{1-10}$ alkyl group having at least one (meth)acryloyloxy group and $R^4$ is a methyl group or an ethyl group.)

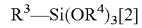

(wherein $R^3$ is a $C_{1-10}$ alkyl group, a $C_{7-10}$ aralkyl group, or a $C_{6-14}$ aryl group and $R^4$ is a methyl group or an ethyl group.)

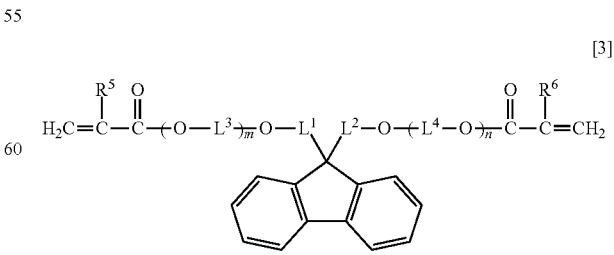

(where $R^5$ and $R^6$ are each independently a hydrogen atom or a methyl group, $L^1$ and $L^2$ are each independently a phenylene group optionally having a substituent or a naphthalenediyl group optionally having a substituent, $L^3$ and $L^4$ are each independently a $C_{1-6}$ alkylene group, and m and n are 0 or a positive integer with m+n satisfying 0 to 40.)

A second aspect of the present invention relates to the polymerizable composition according to the first aspect, wherein $R^3$ is a $C_{6-14}$ aryl group.

A third aspect of the present invention relates to the polymerizable composition according to the first or second aspect, further comprising (c) a (meth)acrylate compound different from the fluorene compound in an amount of 1 to 200 parts by mass relative to 100 parts by mass of the total amount of the components (a) and (b).

A fourth aspect of the present invention relates to the polymerizable composition according to any one of the first to third aspects, further comprising (d) a chain transfer agent in an amount of 0.01 to 20 parts by mass relative to 100 parts by mass of the total amount of the components (a) and (b), or if the component (c) is contained, relative to 100 parts by mass of the total amount of the components (a) to (c).

A fifth aspect of the present invention relates to the polymerizable composition according to any one of the first to fourth aspects, further comprising (e) an antioxidant in an amount of 0.01 to 20 parts by mass relative to 100 parts by mass of the total amount of the components (a) and (b), or if the component (c) is contained, relative to 100 parts by mass of the total amount of the components (a) to (c).

A sixth aspect of the present invention relates to a cured product obtained by curing the polymerizable composition according to any one of the first to fifth aspects.

A seventh aspect of the present invention relates to a material for a resin lens comprising the polymerizable composition according to any one of the first to fifth aspects.

An eighth aspect of the present invention relates to a resin lens manufactured from the polymerizable composition according to any one of the first to fifth aspects.

A ninth aspect of the present invention relates to the resin lens according to the eighth aspect that is a lens for a CMOS image sensor.

A tenth aspect of the present invention relates to a method for manufacturing a molded body comprising steps of filling a space between a support and a mold in contact with the support or a space in a splittable mold with the polymerizable composition according to any one of the first to fifth aspects, and exposing the filled polymerizable composition to light, resulting in photopolymerization.

An eleventh aspect of the present invention relates to the method according to the tenth aspect, further comprising steps of taking out the photopolymerized product from the filled space to release the product from the mold, and heating the photopolymerized product before, during, or after releasing the photopolymerized product from the mold.

A twelfth aspect of the present invention relates to the method according to the tenth or eleventh aspect, wherein the molded body is a resin lens.

Effects of the Invention

In the polymerizable composition of the present invention, a cured product thereof has optical characteristics desirable as an optical device, such as a lens for a CMOS image sensor (e.g., a high refractive index of 1.57 or more and a high transmittance at 400 nm of 95% or more). In addition, the polymerizable composition of the present invention has heat-resistant dimensional stability (e.g., a dimensional change ratio after 500 hours at 125° C. of 2% or less) and heat-resistant transmittance (e.g., a decrease ratio of light transmittance at 400 nm after 500 hours at 150° C. of 1% or less) suitable for a severe heat environment in the usage environment, and the like.

Therefore, the material for a resin lens of the present invention formed from the polymerizable composition can be suitably used as a lens for a CMOS image sensor.

According to the manufacturing method of the present invention, a molded body, especially a resin lens can be efficiently manufactured.

Further, the polymerizable composition of the present invention has such a viscosity that the polymerizable composition can be sufficiently handled in the absence of a solvent. Therefore, the polymerizable composition can be subjected to press working with a mold such as a die (imprint technique) to suitably obtain a molded body. In addition, the polymerizable composition has excellent mold release properties from the mold.

MODES FOR CARRYING OUT THE INVENTION

Photopolymerizable Composition

The polymerizable composition of the present invention is a polymerizable composition comprising a specific reactive silsesquioxane compound as the component (a) and a specific fluorene compound as the component (b), and if desired, another component.

Each of the components will be described in detail below.

(a) Reactive Silsesquioxane Compound (a) The reactive silsesquioxane compound used in the present invention is a compound obtained by polycondensation of an alkoxy silicon compound A having a specific structure described below with an alkoxy silicon compound B having a specific structure in the presence of an acid or a base.

[Alkoxy Silicon Compound A] The alkoxy silicon compound A is a compound of the following Formula [1].

$$R^1-Si(OR^2)_3 \qquad [1]$$

In Formula [1], $R^1$ is a $C_{1-10}$ alkyl group having at least one (meth)acryloyloxy group and $R^2$ is a methyl group or an ethyl group.

In the present invention, the (meth)acryloyloxy group means both an acryloyloxy group and a methacryloyloxy group.

Examples of the $C_{1-10}$ alkyl group having at least one (meth)acryloyloxy group of $R^1$ include (meth)acryloyloxymethyl group, 2-(meth)acryloyloxyethyl group, 3-(meth)acryloyloxypropyl group, 4-(meth)acryloyloxybutyl group, and 8-(meth)acryloyloxyoctyl group.

Specific examples of the compound of Formula [1] include, but not limited to, (meth)acryloyloxymethyltrimethoxysilane, (meth)acryloyloxymethyltriethoxysilane, (2-(meth)acryloyloxyethyl)trimethoxysilane, (2-(meth)acryloyloxyethyl)triethoxysilane, (3-(meth)acryloyloxypropyl)trimethoxysilane, (3-(meth)acryloyloxypropyl)triethoxysilane, (4-(meth)acryloyloxybutyl)trimethoxysilane, (4-(meth)acryloyloxybutyl)triethoxysilane, (8-(meth)acryloyloxyoctyl)trimethoxysilane, and (8-(meth)acryloyloxyoctyl)triethoxysilane.

[Alkoxy Silicon Compound B]
The alkoxy silicon compound B is a compound of the following Formula [2].

$$R^3-Si(OR^4)_3 \qquad [2]$$

In Formula [2], $R^3$ is a $C_{1-10}$ alkyl group, a $C_{7-10}$ aralkyl group, or a $C_{6-14}$ aryl group and $R^4$ is a methyl group or an ethyl group.

The $C_{1-10}$ alkyl group of $R^3$ may be any of linear, branched, or cyclic alkyl group. Examples thereof include methyl group, ethyl group, n-propyl group, isopropyl group, cyclopropyl group, n-butyl group, isobutyl group, sec-butyl group, tert-butyl group, n-pentyl group, isoamyl group, neopentyl group, tert-amyl group, sec-isoamyl group, cyclopentyl group, n-hexyl group, cyclohexyl group, n-heptyl group, n-octyl group, n-nonyl group, and n-decyl group.

Examples of the $C_{7-10}$ aralkyl group (arylalkyl group) of $R^3$ include benzyl group, phenethyl group, and phenylpropyl group.

Examples of the $C_{6-14}$ aryl group of $R^3$ include phenyl group, tolyl group, xylyl group, phenoxyphenyl group, biphenyl group, naphthyl group, and phenanthryl group. Among these, the $C_{6-12}$ aryl group is preferable.

Among these, $R^3$ is preferably the $C_{6-14}$ aryl group, and particularly preferably a phenyl group, a biphenyl group, a naphthyl group, or a phenanthryl group. Further, $R^3$ is preferably the $C_{6-12}$ aryl group.

Specific examples of the compound of Formula [2] include, but not limited to, trimethoxy(methyl)silane, triethoxy(methyl)silane, ethyltrimethoxysilane, ethyltriethoxysilane, trimethoxy(propyl)silane, triethoxy(propyl)silane, benzyltrimethoxysilane, benzyltriethoxysilane, trimethoxy(phenethyl)silane, triethoxy(phenethyl)silane, trimethoxy(phenyl)silane, triethoxy(phenyl)silane, trimethoxy(p-tolyl)silane, trimethoxy(4-phenoxyphenyl)silane, triethoxy(4-phenoxyphenyl)silane, [1,1'-biphenyl]-4-yltrimethoxysilane, trimethoxy(naphthalen-1-yl)silane, triethoxy(naphthalen-1-yl)silane, trimethoxy(naphthalen-2-yl)silane, triethoxy(naphthalen-2-yl)silane, trimethoxy(2-phenanthryl)silane, trimethoxy(3-phenanthryl)silane, trimethoxy(9-phenanthryl)silane, and triethoxy(9-phenanthryl)silane.

[Mixing Ratio of Alkoxy Silicon Compound A and Alkoxy Silicon Compound B]

A mixing ratio in a polycondensation reaction of the alkoxy silicon compound A of Formula [1] with the alkoxy silicone compound B of Formula [2] that are used for the reactive silsesquioxane compound as the component (a) is a ratio by mole of the alkoxy silicon compound B to the alkoxy silicon compound A of 0 to 99. The ratio by mole of the alkoxy silicon compound B to the alkoxy silicon compound A is preferably 0 to 20, more preferably 0 to 4, and particularly preferably 0 to 1.5.

When the alkoxy silicon compounds A and B are used at a ratio falling within the aforementioned range, fixation in the cured product is promoted, and the dimensional stability over heat is more improved.

As the alkoxy silicon compounds A and B, a compound can be appropriately selected if necessary, and used. As each of the alkoxy silicon compounds A and B, a plurality of kinds of compound can be used in combination. In this case, the mixing molar ratio of the total molar amount of the alkoxy silicon compound B to that of the alkoxy silicon compound A falls within the aforementioned range.

[Acid or Base Catalyst]

The polycondensation reaction of the alkoxy silicon compound A of Formula [1] or the polycondensation reaction of the alkoxy silicon compound A with the alkoxy silicon compound B of Formula [2] is suitably performed in the presence of an acid or base catalyst.

The kind of the catalyst used in the polycondensation reaction is not particularly limited as long as it is dissolved in a solvent described below or uniformly dispersed. The catalyst may be appropriately selected if necessary, and used.

Examples of usable catalyst include acidic compounds including inorganic acid such as hydrochloric acid, nitric acid, and sulfuric acid, and organic acids such as acetic acid and oxalic acid; basic compounds including alkali metal hydroxides, alkaline-earth metal hydroxides, ammonium hydroxide, quaternary ammonium salts, and amines; and fluoride salts such as $NH_4F$ and $NR_4F$. Here, R is at least one selected from the group consisting of a hydrogen atom, a linear alkyl group having a carbon atom number of 1 to 12, a branched alkyl group having a carbon atom number of 3 to 12, and a cyclic alkyl group having a carbon atom number of 3 to 12.

One kind of the catalyst can be used alone or two or more kinds thereof can be used in combination.

Examples of the acidic compounds include hydrochloric acid, nitric acid, sulfuric acid, acetic acid, oxalic acid, and boric acid.

Examples of the basic compound include sodium hydroxide, potassium hydroxide, magnesium hydroxide, calcium hydroxide, strontium hydroxide, barium hydroxide, ammonium hydroxide, tetramethylammonium hydroxide, tetraethylammonium hydroxide, tetrabutylammonium hydroxide, and triethylamine.

Examples of the fluoride salts include ammonium fluoride, tetramethylammonium fluoride, and tetrabutylammonium fluoride.

Among these catalysts, one or more selected from the group consisting of hydrochloric acid, acetic acid, potassium hydroxide, calcium hydroxide, barium hydroxide, and tetraethylammonium hydroxide is preferably used.

The amount of the catalyst to be used is 0.01 to 10% by mass, and preferably 0.1 to 5% by mass, relative to the total amount of the alkoxy silicon compounds A and B. When the amount of the catalyst to be used is 0.01% by mass or more, the reaction favorably proceeds. In terms of economic efficiency, the use of 10% by mass or less of the catalyst is sufficient.

[Polycondensation Reaction]

The structure of the alkoxy silicon compound A is one of characteristics of the reactive silsesquioxane compound according to the present invention. A (meth)acryloyloxy group (polymerizable double bond) as a reactive group in the alkoxy silicon compound A used in the present invention is easily polymerized by radicals or cations, and exhibits high heat resistance (heat-resistant dimensional stability and heat-resistant transmittance) after polymerization (after curing).

A hydrolysis polycondensation reaction of the alkoxy silicon compound A with the alkoxy silicon compound B can be carried out in the absence of a solvent. Further, as a reaction solvent, a solvent inert to both the alkoxy silicon compounds, such as tetrahydrofuran (THF) described below can be used. An advantage of using a reaction solvent is that a reaction system is easily made uniform to more stably cause the polycondensation reaction.

As described above, a synthesis reaction of the reactive silsesquioxane compound may be carried out in the absence of the solvent. However, the solvent may be used to make the reaction more uniform without problems. The solvent is not particularly limited as long as it is not reacted with both the alkoxy silicon compounds and allows a polycondensate to be dissolved.

Examples of such a reaction solvent include ketones such as acetone and methyl ethyl ketone (MEK); aromatic hydrocarbons such as benzene, toluene, and xylene; ethers such as tetrahydrofuran (THF), 1,4-dioxane, diisopropyl ether, and cyclopentyl methyl ether (CPME); glycols such as ethylene glycol, propylene glycol, and hexylene glycol; glycol ethers such as ethyl cellosolve, butyl cellosolve, ethyl carbitol, butyl carbitol, diethyl cellosolve, and diethyl carbitol; and amides such as N-methyl-2-pyrrolidone (NMP) and N,N-dimethylformamide (DMF). One kind of the solvent may be used alone or two or more kinds thereof may be used as a mixture.

The reactive silsesquioxane compound used in the present invention is obtained by hydrolysis polycondensation of the alkoxy silicon compound A of Formula [1] or of the alkoxy silicon compound A with the alkoxy silicon compound B of Formula [2] in the presence of an acid or base catalyst. The reaction temperature in the hydrolysis polycondensation is 20 to 150° C., and preferably 30 to 120° C.

The reaction time is not particularly limited as long as it is equal to or longer than a time required for termination of an increase in the molecular weight of a polycondensate and stabilization of molecular weight distribution. More specifically, the reaction time is several hours to several days.

After completion of the polycondensation reaction, it is preferable that the obtained reactive silsesquioxane compound be collected by any procedure such as filtration and solvent distillation, and if necessary, appropriately purified.

The reactive silsesquioxane compound used in the present invention can be produced by polycondensation of the alkoxy silicon compound A of Formula [1] or of the alkoxy silicon compound A with the alkoxy silicon compound B of Formula [2] in the presence of a base, followed by removing the base by using a cation exchange resin.

As the base and the amount of the base used, one or more compounds selected from the group consisting of the basic compounds and the fluoride salts or the amount of the compounds used, respectively, can be adapted. One or more compounds selected from the group consisting of potassium hydroxide, calcium hydroxide, barium hydroxide, and tetraethylammonium hydroxide can be preferably used as the base.

As the reaction condition and reaction solvent used in the polycondensation reaction, those described above can be adapted.

As the cation exchange resin used in removal of the base after completion of the reaction, an ion exchange resin having a sulfo group as an ionic group is preferably used.

Examples of a commercially available strongly acidic cation exchange resin include AMBERLITE (registered trademark) 15, 200, 200C, 200CT, 252, 1200H, IR120B, IR120H, IR122Na, IR124, IRC50, IRC86, IRN77, IRP-64, IRP-69, CG-50, and CG-120, AMBERJET (registered trademark) 1020, 1024, 1060, 1200, and 1220, AMBERLYST (registered trademark) 15, 15DRY, 15JWET, 16, 16WET, 31WET, 35WET, and 36, DOWEX (registered trademark) 50Wx2, 50Wx4, 50Wx8, DR-2030, DR-G8, HCR-W2, 650C UPW, G-26, 88, M-31, and N-406, DOWEX (registered trademark) MONOSPHERE (registered trademark) 650C, 88, M-31, 99K/320, 99K/350, and 99Ca/320, DOWEX MARATHON (registered trademark) MSC and C (all available from The Dow Chemical Company); DIAION (registered trademark) EXC04, HPK25, PK208, PK212, PK216, PK220, PK228L, RCP160M, SK1B, SK1BS, SK104, SK110, SK112, SK116, UBK510L, and UBK555 (all available from Mitsubishi Chemical Corporation); and Lewatit (registered trademark) MonoPlusS100 and MonoPlusSP112 (all available from LANXESS).

Examples of a commercially available weakly acidic cation exchange resin include AMBERLITE (registered trademark) CG-50, FPC3500, IRC50, IRC76, IRC86, and IRP-64, and DOWEX (registered trademark) MAX-3 (all available from The Dow Chemical Company); and DIAION (registered trademark) CWK30/S, WK10, WK11, WK40, WK100, and WT01S (all available from Mitsubishi Chemical Corporation).

The polycondensate obtained by such a reaction has a weight average molecular weight Mw measured in terms of polystyrene by GPC, of 500 to 100,000, and preferably 500 to 30,000, and a dispersity: Mw (weight average molecular weight)/Mn (number average molecular weight), of 1.0 to 10.

The reactive silsesquioxane compound (a) is a compound having at least a siloxane unit of $[R^1SiO_{3/2}]$, further optionally having a siloxane unit of $[R^3SiO_{3/2}]$, and having a crosslinking structure.

(b) Fluorene Compound

The fluorene compound (b) used in the present invention is a compound of Formula [3].

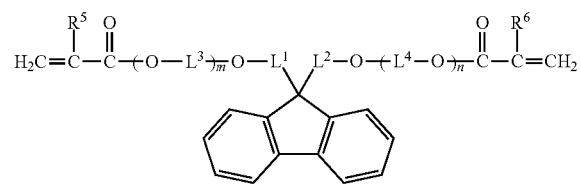

[3]

In Formula [3], $R^5$ and $R^6$ are each independently a hydrogen atom or a methyl group, $L^1$ and $L^2$ are each independently a phenylene group optionally having a substituent or a naphthalenediyl group optionally having a substituent, $L^3$ and $L^4$ are each independently a $C_{1-6}$ alkylene group, and m and n are 0 or a positive integer with m+n satisfying 0 to 40.

Examples of the phenylene group optionally having a substituent of $L^1$ and $L^2$ include o-phenylene group, m-phenylene group, p-phenylene group, 2-methylbenzene-1,4-diyl group, 2-aminobenzene-1,4-diyl group, 2,4-dibromobenzene-1,3-diyl group, and 2,6-dibromobenzene-1,4-diyl group.

Examples of the naphthalenediyl group optionally having a substituent of $L^1$ and $L^2$ include 1,2-naphthalenediyl group, 1,4-naphthalenediyl group, 1,5-naphthalenediyl group, 1,8-naphthalenediyl group, 2,3-naphthalenediyl group, and 2,6-naphthalenediyl group.

Examples of the $C_{1-6}$ alkylene group of $L^3$ and $L^4$ include methylene group, ethylene group, trimethylene group, 1-methylethylene group, tetramethylene group, 1-methyltrimethylene group, 1,1-dimethyl ethylene group, pentamethylene group, 1-methyltetramethylene group, 2-methyltetramethylene group, 1,1-dimethyltrimethylene group, 1,2-dimethyltrimethylene group, 2,2-dimethyltrimethylene group, 1-ethyltrimethylene group, hexamethylene group, 1-methylpentamethylene group, 2-methylpentamethylene group, 3-methylpentamethylene group, 1,1-dimethyltetramethylene group, 1,2-dimethyltetramethylene group, 2,2-dimethyltetramethylene group, 1-ethyltetramethylene group, 1,1,2-trimethyltrimethylene group, 1,2,2-trimethyltrimethylene group, 1-ethyl-1-methyltrimethylene group, and 1-ethyl-2-methyltrimethylene group.

In the compound of Formula [3], m and n preferably satisfy that m+n is 0 to 30, and more preferably satisfy that m+n is 2 to 20.

Specific examples of the compound of Formula [3] include, but not limited to, 9,9-bis(4-(2-(meth)acryloyloxyethoxy)phenyl)-9H-fluorene, OGSOL (registered trademark) EA-0200, EA-0300, EA-F5003, EA-F5503, EA-F5510, EA-F5710, and GA-5000 (all available from Osaka Gas Chemicals Co., Ltd.), and NK ester A-BPEF (available from Shin Nakamura Chemical Co., Ltd.).

In the polymerizable composition of the present invention, the content of the component (b) is 10 to 2,000 parts by mass, preferably 50 to 1,000 parts by mass, and more preferably 100 to 500 parts by mass, relative to 100 parts by mass of the component (a).

When the ratio of the content of the component (a) in the total content of the components (a) and (b) is increased, the heat-resistant dimensional stability in the polymerizable composition of the present invention is improved. When the ratio of the content of the component (b) is increased, the refractive index is increased.

(c) (Meth)Acrylate Compound Different from the Fluorene Compound

The polymerizable composition of the present invention may further contain (c) a (meth)acrylate compound different from the fluorene compound, as a component (c). In particular, a mono(meth)acrylate compound having an aromatic group is preferable.

In the present invention, the (meth)acrylate compound refers to both acrylate and methacrylate compounds. For example, (meth)acrylic acid refers to acrylic acid and methacrylic acid.

Examples of the mono(meth)acrylate compound having an aromatic group include, but not limited to, benzyl (meth)acrylate, 2-phenoxyethyl (meth)acrylate, diethylene glycol monophenyl ether (meth)acrylate, polyethylene glycol monophenyl ether (meth)acrylate, 2-hydroxy-3-phenoxypropyl (meth)acrylate, neopentyl glycol benzoate (meth)acrylate, and ethoxylated o-phenylphenol (meth)acrylate.

Examples of a (meth)acrylate compound other than the mono(meth)acrylate compound having an aromatic group as the component (c) include, but not limited to, methyl (meth)acrylate, ethyl (meth)acrylate, 2,2,2-trifluoroethyl (meth)acrylate, n-propyl (meth)acrylate, isopropyl (meth)acrylate, n-butyl (meth)acrylate, sec-butyl (meth)acrylate, isobutyl (meth)acrylate, tert-butyl (meth)acrylate, n-hexyl (meth)acrylate, n-octyl (meth)acrylate, isobornyl (meth)acrylate, adamantyl (meth)acrylate, dicyclopentanyl (meth)acrylate, dicyclopentenyl (meth)acrylate, 2-(dicyclopentanyloxy)ethyl (meth)acrylate, 2-(dicyclopentenyloxy)ethyl (meth)acrylate, tetrahydrofurfuryl (meth)acrylate, ethylene glycol di(meth)acrylate, diethylene glycol di(meth)acrylate, polyethylene glycol di(meth)acrylate, propylene glycol di(meth)acrylate, dipropylene glycol di(meth)acrylate, tripropylene glycol di(meth)acrylate, polypropylene glycol di(meth)acrylate, 1,3-butanediol di(meth)acrylate, 1,4-butanediol di(meth)acrylate, neopentyl glycol di(meth)acrylate, propoxylated neopentyl glycol di(meth)acrylate, neopentyl glycol mono(hydroxypivalate) (meth)acrylate, 3-methyl-1,5-pentanediol di(meth)acrylate, 1,6-hexanediol di(meth)acrylate, 2-(3-hydroxy-2-methylpropyl-2-yl)-5-ethyl-5-hydroxymethyl-1,3-dioxane di(meth)acrylate (referred to as dioxane glycol di(meth)acrylate), tricyclo[5.2.1.0$^{2,6}$]decanedimethanol di(meth)acrylate, trimethylolethane tri(meth)acrylate, trimethylolpropane tri(meth)acrylate, ethoxylated trimethylolpropane tri(meth)acrylate, propoxylated trimethylolpropane tri(meth)acrylate, pentaerythritol tetra(meth)acrylate, ethoxylated pentaerythritol tetra(meth)acrylate, ditrimethylolpropane tetra(meth)acrylate, and dipentaerythritol hexa(meth)acrylate.

When the (meth)acrylate compound as the component (c) is added, one kind of the compound may be used alone or two or more kinds thereof may be used as a mixture. The amount of the compound to be added is 1 to 200 parts by mass, and preferably 10 to 50 parts by mass, relative to 100 parts by mass of the total amount of the components (a) and (b).

(d) Chain Transfer Agent

The polymerizable composition of the present invention may contain the components (a) and (b), and if desired, the component (c) and (d) a chain transfer agent. Examples of the chain transfer agent include a thiol compound, a disulfide compound, and an [alpha]-methylstyrene dimer.

Examples of the thiol compound include mercaptocarboxylates such as methyl mercaptoacetate, methyl 3-mercaptopropionate, 2-ethylhexyl 3-mercaptopropionate, 3-methoxybutyl 3-mercaptopropionate, n-octyl 3-mercaptopropionate, stearyl 3-mercaptopropionate, 1,4-bis(3-mercaptopropionyloxy)butane, 1,4-bis(3-mercaptobutyryloxy)butane, trimethylolethane tris(3-mercaptopropionate), trimethylolethane tris(3-mercaptobutyrate), trimethylolpropane tris(3-mercaptopropionate), trimethylolpropane tris(3-mercaptobutyrate), pentaerythritol tetrakis(3-mercaptopropionate), pentaerythritol tetrakis(3-mercaptobutyrate), dipentaerythritol hexakis(3-mercaptopropionate), dipentaerythritol hexakis(3-mercaptobutyrate), tris[2-(3-mercaptopropionyloxy)ethyl] isocyanurate, and tris[2-(3-mercaptobutyryloxy)ethyl] isocyanurate; alkylthiols such as ethanethiol, 2-methylpropane-2-thiol, n-dodecanethiol, 2,3,3,4,4,5-hexamethylhexane-2-thiol (tert-dodecanethiol), ethane-1,2-dithiol, propane-1,3-dithiol, and benzylthiol; aromatic thiols such as benzenethiol, 3-methylbenzenethiol, 4-methylbenzenethiol, naphthalene-2-thiol, pyridine-2-thiol, benzimidazole-2-thiol, and benzothiazole-2-thiol; mercaptoalcohols such as 2-mercaptoethanol and 4-mercapto-1-butanol; and silane-containing thiols such as 3-(trimethoxysilyl)propane-1-thiol and 3-(triethoxysilyl)propane-1-thiol.

Examples of the disulfide compound include alkyl disulfides such as diethyl disulfide, dipropyl disulfide, diisopropyl disulfide, dibutyl disulfide, di-tert-butyl disulfide, dipentyl disulfide, diisopentyl disulfide, dihexyl disulfide, dicyclohexyl disulfide, didecyl disulfide, bis(2,3,3,4,4,5-hexamethylhexan-2-yl) disulfide(di-tert-dodecyl disulfide), bis(2,2-diethoxyethyl) disulfide, bis(2-hydroxyethyl) disulfide, and dibenzyl disulfide; aromatic disulfides such as diphenyl disulfide, di-p-tolyl disulfide, di(pyridin-2-yl) disulfide, di(benzimidazol-2-yl) disulfide, and di(benzothiazol-2-yl) disulfide; and thiuram disulfides such as tetramethylthiuram disulfide, tetraethylthiuram disulfide, tetrabutylthiuram disulfide, and bis(pentamethylene)thiuram disulfide.

When the chain transfer agent is added, one kind of the chain transfer agent may be used alone or two or more kinds thereof may be used as a mixture. The amount of the chain transfer agent to be added is 0.01 to 20 parts by mass, and more preferably 0.1 to 10 parts by mass, relative to 100 parts by mass of the total amount of the polymerizable components, that is, the components (a) and (b), or if the component (c) is contained, 100 parts by mass of the total amount of the components (a) to (c).

(e) Antioxidant

The polymerizable composition of the present invention may contain the components (a) and (b), and if desired, the components (c) and (d) and (e) an antioxidant.

Examples of the antioxidant include a phenol-based antioxidant, a phosphoric acid-based antioxidant, and a sulfide-based antioxidant. Among these, the phenol-based antioxidant is preferable.

Examples of the phenol-based antioxidant include IRGANOX (registered trademark) 245, 1010, 1035, 1076, and 1135 (all available from BASF Japan Ltd.), SUMILIZER (registered trademark) GA-80, GP, MDP-S, BBM-S, and WX-R (all available from Sumitomo Chemical Co., Ltd.), and ADK STAB (registered trademark) AO-20, AO-30, AO-40, AO-50, AO-60, AO-80, and AO-330 (all available from ADEKA Corporation).

When the antioxidant is added, one kind of the antioxidant may be used alone or two or more kinds thereof may be used as a mixture. The amount of the antioxidant to be added is 0.01 to 20 parts by mass, and more preferably 0.1 to 10 parts by mass, relative to 100 parts by mass of the total amount of the polymerizable components, that is, the components (a) and (b), or if the component (c) is contained, 100 parts by mass of the total amount of the components (a) to (c).

Polymerization Initiator

The polymerizable composition of the present invention may contain the components (a) and (b), and if desired, the components (c) to (e) and a polymerization initiator. As the polymerization initiator, any of a photopolymerization initiator and a thermal polymerization initiator can be used.

Examples of the photopolymerization initiator include alkylphenones, benzophenones, acylphosphine oxides, Michler's benzoylbenzoates, oxime esters, tetramethylthiuram monosulfides, and thioxanthones.

In particular, a photo-cleavage type photo-radical polymerization initiator is preferable. Examples of the photo-cleavage type photo-radical polymerization initiator include a photo-cleavage type photo-radical polymerization initiator described in "Saishin UV Kouka-Gijutsu" (p. 159, published by Kazuhiro Takausu, Technical Information Institute Co., Ltd., 1991).

Examples of a commercially available photo-radical polymerization initiator include IRGACURE (registered trademark) 184, 369, 651, 500, 819, 907, 784, 2959, CGI1700, CGI1750, CGI1850, and CG24-61, TPO, and Darocur (registered trademark) 1116 and 1173 (all available from BASF Japan Ltd.), and ESACURE KIP150, KIP65LT, KIP100F, KT37, KT55, KT046, and KIP75 (all available from Lamberti).

Examples of the thermal polymerization initiator include azos and organic peroxides.

Examples of a commercially available azo-based thermal polymerization initiator include V-30, V-40, V-59, V-60, V-65, and V-70 (all available from Wako Pure Chemical Industries, Ltd.).

Examples of a commercially available organic peroxide-based thermal polymerization initiator include, but not limited to, Perkadox (registered trademark) CH, BC-FF, 14, and 16, Trigonox (registered trademark) 22, 23, and 121, Kayaester (registered trademark) P and O, and Kayabutyl (registered trademark) B (all available from Kayaku Akzo Corporation), PERHEXA (registered trademark) HC, PERCUMYL (registered trademark) H, PEROCTA (registered trademark) O, PERHEXYL (registered trademark) O and Z, and PERBUTYL (registered trademark) O and Z (all available from NOF CORPORATION).

When the polymerization initiator is added, one kind of the polymerization initiator may be used alone or two or more kinds thereof may be used as a mixture. The amount of the polymerization initiator to be added is 0.1 to 20 parts by mass, and more preferably 0.3 to 10 parts by mass, relative to 100 parts by mass of the total amount of the polymerizable components, that is, the components (a) and (b), or if the component (c) is contained, 100 parts by mass of the total amount of the components (a) to (c).

Other Additive

The polymerizable composition of the present invention can further contain an ultraviolet absorber, a photostabilizer, a leveling agent, a rheology controlling agent, an adhesion adjuvant such as a silane coupling agent, a pigment, a dye, an antifoam agent, or the like, if necessary, as long as it does not impair the effects of the present invention.

Method for Preparing Polymerizable Composition

A method for preparing the polymerizable composition of the present embodiment is not particularly limited. Examples of the method include a method in which the components (a) and (b), and if necessary, the components (c) to (e), and the polymerization initiator are mixed at a predetermined ratio, and if desired, the other additive is further added followed by mixing, to obtain a uniform solution, and a method in which among the components described above, for example, the components (a) and (b) and if desired, at least a part of at least two components of the components (c) to (e) and the polymerization initiator are mixed to obtain a uniform solution, the rest is added, and if desired, the other additive is further added followed by mixing, to obtain a uniform solution, and a method using a commonly used solvent in addition to the components.

When a solvent is used, the ratio of a solid content in the polymerizable composition is not particularly limited as long as it allows each component to be uniformly dissolved. For example, the ratio is 1 to 50% by mass, 1 to 30% by mass, or 1 to 25% by mass. Here, the solid content is a content of all the components of the polymerizable composition except for a solvent component.

It is preferable that a solution of the polymerizable composition be used after filtration through a filter having a pore diameter of 0.1 to 5 µm or the like.

Cured Product

In the present invention, the polymerizable composition can be exposed to light (photo-cured) or heated (thermally cured) to obtain a cured product.

Examples of exposure light include ultraviolet light, an electron beam, and X ray. As a light source used for ultraviolet irradiation, sunlight, a chemical lamp, a low-pressure mercury vapor lamp, a high-pressure mercury vapor lamp, a metal halide lamp, a xenon lamp, an UV-LED, or the like may be used. After exposure to light, post-baking may be carried out to stabilize the physical properties of the cured product. A method for post-baking is not particularly limited. The method is generally carried out by using a hot plate, an oven, or the like at 50 to 260° C. for 1 to 120 minutes.

A heating condition in thermal curing is not particularly limited. In general, the heating condition is appropriately selected from ranges of 50 to 300° C. and 1 to 120 minutes. A heating means is not particularly limited, but examples thereof include a hot plate and an oven.

The cured product obtained by curing the polymerizable composition of the present invention has a high refractive index at a wavelength of 633 nm of 1.57 or more, is very slightly discolored (yellowed) due to heating, suppresses a decrease in light transmittance, and has high dimensional stability. Therefore, the cured product can be suitably used as a material for a high-refractive index resin lens.

Molded Body

For example, the polymerizable composition of the present invention is used in a common molding method such as compression molding (imprinting, etc.), casting, injection molding, and blow molding. In this case, the cured product can be produced, and at the same time, various types of molded body can be easily produced. The resultant molded body is also a subject of the present invention.

A method for producing the molded body is preferably a method including steps of filling a space between a support and a mold in contact with the support or a space in a splittable mold with the polymerizable composition of the present invention, exposing the filled composition to light, resulting in photopolymerization, taking out the obtained photopolymerized product from the filled space to release the product from the mold, and heating the photopolymerized product before, during, or after releasing the photopolymerized product from the mold.

In the step of filling the space with polymerizable composition, the mold may be placed on the support, for example, a glass substrate, and the space between the support and the mold may be filled with the polymerizable composition of the present invention. For example, the space in the mold capable of splitting into two or three parts may be filled with the polymerizable composition.

The step of photopolymerization by exposure can be carried out under a condition shown in the "Cured Product" described above.

In the heating step, the photopolymerized product may be heated before, after, during the mold releasing step, that is, at the same time of releasing the mold. In addition, the photopolymerized product may be heated throughout before and after the mold releasing step. For example, the photopolymerized product may be taken out from the filled space between the support and the mold and heated on the support. The photopolymerized product filled in the space in the splittable mold may be heated without taking out from the space.

A condition in the heating step is not particularly limited. In general, the condition is appropriately selected from ranges of 50 to 260° C. and 1 to 120 minutes. The heating means is not particularly limited. Examples of the heating means include a hot plate and an oven.

The molded body produced by such a method can be suitably used as a lens for a CMOS image sensor.

EXAMPLES

Hereinafter, the present invention will be described more specifically with reference to Examples, but the present invention is not limited to Examples below.

Apparatuses and conditions used in preparation of samples and analyses of physical properties in Examples will be described as follows.

(1) Gel Permeation Chromatography (GPC)
Apparatus: Prominence (registered trademark) GPC system manufactured by Shimadzu Corporation
Column: Shodex (registered trademark) GPC KF-804L and GPC KF-803L manufactured by Showa Denko K.K.
Column Temperature: 40° C.
Solvent: tetrahydrofuran
Detector: RI
Calibration curve: Standard polystyrene
(2) Measurement of Volatile Content
Apparatus: Halogen moisture analyzer HR83 manufactured by Mettler Toledo
(3) Refractive Index
Apparatus: Model 2010/M prism coupler manufactured by Metricon
Measurement Temperature: 23° C.
(4) Light Transmittance
Apparatus: Ultraviolet-visible-near infrared spectrophotometer V-670 manufactured by Jasco Corporation
(5) Lens Height
Apparatus: Contactless surface texture measuring instrument PF-60 manufactured by Mitaka Kohki Co., Ltd.
(6) Stirring Defoaming Apparatus
Apparatus: Planetary centrifugal mixer, "AWATORI RENTARO" (registered trademark) ARE-310, manufactured by Thinky Corporation
(7) UV Exposure
Apparatus: batch process UV irradiation apparatus (high-pressure mercury lamp 2 kW×1 lamp) manufactured by Eye Graphics Co., Ltd.
(8) Nanoimprinter
Apparatus: NM-0801HB manufactured by Meisyo Kiko, Co., Ltd.
Pressing pressure: 150 N
Lamp: short arc mercury lamp manufactured by Toshiba Corporation
UV exposure dose: 20 mW/cm$^2$ (detection at 365 nm), 150 seconds Abbreviations mean as follows.
APTMS: (3-acryloyloxypropyl)trimethoxysilane (Shin-Etsu silicone (registered trademark) KBM-5103 available from Shin-Etsu Chemical Co., Ltd.)
MPTMS: (3-methacryloyloxypropyl)trimethoxysilane (Shin-Etsu silicone (registered trademark) KBM-503 available from Shin-Etsu Chemical Co., Ltd.)
PTMS: trimethoxy(phenyl)silane (Shin-Etsu silicone (registered trademark) KBM-103 available from Shin-Etsu Chemical Co., Ltd.)
STMS: trimethoxy(4-vinylphenyl)silane (Shin-Etsu silicone (registered trademark) KBM-1403 available from Shin-Etsu Chemical Co., Ltd.)
TMOS: tetramethoxysilane (available from Tokyo Chemical Industry Co., Ltd.)
AP10: 3-acryloyloxypropyl group-containing silsesquioxane (AC-SQ TA-100 available from Toagosei Co., Ltd., acrylic equivalent: 165 g/eq)
BnA: benzyl acrylate (Viscoat #160 available from Osaka Organic Chemical Industry Ltd.)
FDA: bisarylfluorene diacrylate (OGSOL (registered trademark) EA-F5503, available from Osaka Gas Chemicals Co., Ltd.)
DDDS: didecyl disulfide (available from Tokyo Chemical Industry Co., Ltd.)
DDT: n-dodecanethiol (THIOKALCOL 20 available from Kao Corporation)
I1010: pentaerythrityl tetrakis[3-(3,5-di-tert-butyl-4-hydroxyphenyl)propionate] (IRGANOX (registered trademark) 1010 available from BASF Japan Ltd.)
I184: 1-hydroxycyclohexyl phenyl ketone (IRGACURE (registered trademark) 184 available from BASF Japan Ltd.)
TPO: diphenyl(2,4,6-trimethylbenzoyl)phosphine oxide (IRGACURE (registered trademark) TPO available from BASF Japan Ltd.)
THF: tetrahydrofuran

[Production Example 1] Production of Silsesquioxane Compound 1 (AP55) Solution 2.97 g (7.1 mmol) of 35% by mass tetraethylammonium hydroxide aqueous solution (available from Aldrich), 9.56 g (531 mmol) of deionized water, and 92 g of THF were placed into a 300-mL reaction flask equipped with a condenser, and an air in the flask was replaced by nitrogen with a nitrogen balloon. To the flask, a mixture of 41.3 g (177 mmol) of APTMS and 35.0 g (177 mmol) of PTMS was added dropwise at room temperature (about 23° C.) for 10 minutes. The reaction mixture was heated to 40° C. and stirred for 16 hours.

The reaction mixture was then cooled to room temperature (about 23° C.), 71 g of 1.2% by mass acetic acid/ethyl acetate solution (14 mmol of acetic acid) was added, and the liquid properties of an aqueous phase were changed to neutral to acidity to terminate the reaction. Subsequently, this reaction mixture was added to 448 g of ethyl acetate and 223 g of deionized water, and an organic phase was isolated by using a separation funnel. The obtained organic phase was washed with deionized water three times and concentrated by using a rotary evaporator to obtain 111.5 g of silsesquioxane compound 1 (hereinafter abbreviated to AP55) solution.

From measurement of volatile matter at 100° C., the content of AP55 in the obtained solution was 46.7% by mass. The weight average molecular weight Mw in terms of polystyrene measured by GPC of the obtained compound was 2,900, and the dispersity Mw (weight average molecular weight)/Mn (number average molecular weight) was 1.5.

[Production Example 2] Production of trimethoxy(9-phenanthryl)silane (PheTMS)

10.4 g (0.43 mol) of magnesium cut piece (available from Kanto Chemical Co., Inc.) was placed into a 500-mL reaction flask equipped with a condenser, and an air in the flask was replaced by nitrogen with a nitrogen balloon. To the flask, a mixture of 100.3 g (0.39 mol) of 9-bromophenanthrene (available from Tokyo Chemical Industry Co., Ltd.) and 346 g of THF was added dropwise at room temperature (about 23° C.) for 1 hour, and stirred for 30 minutes, to prepare a Grignard reagent.

178.0 g (1.17 mol) of TMOS and 346 g of THF were placed into a 1-L reaction flask, and an air in the flask was replaced by nitrogen with a nitrogen balloon. To the flask, the Grignard reagent was added dropwise at room temperature (about 23° C.) for 30 minutes, and stirred for 2 hours. From the reaction mixture, THF was distilled off under reduced pressure by using an evaporator. To the resulting residue, 1,000 g of hexane was added. The soluble substance was dissolved, and the insoluble substance was separated by filtration. To the insoluble substance, 500 g of hexane was added again, and the insoluble substance was separated by filtration in the same manner. Each filtrate was mixed, and hexane was distilled off under reduced pressure by using an evaporator to obtain a crude product. The crude product was subjected to distillation under reduced pressure (1 mmHg, 120 to 150° C.), and then recrystallized by using 389 g of methanol, to obtain 74.6 g of PheTMS (yield: 64%) as a target.

[Production Example 3] Production of Silsesquioxane Compound 3 (APe55)

1.23 g (2.7 mmol) of 35% by mass tetraethylammonium hydroxide aqueous solution (available from Aldrich), 1.44 g (80 mmol) of deionized water, and 7 g of THF were placed into a 50-mL reaction flask equipped with a condenser, and an air in the flask was replaced by nitrogen with a nitrogen balloon. To the flask, a mixture of 7.85 g (34 mmol) of APTMS and 10.0 g (34 mmol) of PheTMS was added dropwise at room temperature (about 23° C.) for 10 minutes. The reaction mixture was heated to 40° C. and stirred for 16 hours.

Subsequently, the reaction mixture was cooled to room temperature (about 23° C.). 3.6 g of cation exchange resin washed with THF in advance (AMBERLYST (registered trademark) 15JWET available from The Dow Chemical Company) and 0.72 g of filter aid (KC FLOCK W-100GK available from Nippon Paper Industries Co., Ltd.) were added, and the mixture was stirred for 1 hour, and the reaction was terminated. Subsequently, the cation exchange resin and the filter aid were filtered through a membrane filter with a pore diameter of 0.5 μm, and washed with 18 g of ethyl acetate. The filtrate and the cleaning liquid were combined and the solvent was distilled off under reduced pressure by using a rotary evaporator, to obtain 13.2 g of silsesquioxane compound 3 (hereinafter abbreviated to APe55).

The weight average molecular weight Mw in terms of polystyrene measured by GPC of the obtained compound was 1,600, and the dispersity Mw/Mn was 1.1.

[Comparative Production Example 1] Production of Silsesquioxane Compound 2 (SP55) Solution 2.97 g (7.1 mmol) of 35% by mass tetraethylammonium hydroxide aqueous solution (available from Aldrich), 9.56 g (531 mmol) of deionized water, and 90 g of THF were placed into a 300-mL reaction flask equipped with a condenser, and an air in the flask was replaced by nitrogen with a nitrogen balloon. To the flask, a mixture of 39.6 g (177 mmol) of STMS and 35.0 g (177 mmol) of PTMS was added dropwise at room temperature (about 23° C.) for 10 minutes. The reaction mixture was heated to 40° C. and stirred for 4 hours.

The reaction mixture was then cooled to room temperature (about 23° C.), 71 g of 1.2% by mass acetic acid/ethyl acetate solution (14 mmol of acetic acid) was added, and the liquid properties of an aqueous phase were changed to neutral to acidity to terminate the reaction. Subsequently, this reaction mixture was added to 448 g of ethyl acetate and 223 g of deionized water, and an organic phase was isolated by using a separation funnel. The obtained organic phase was washed with deionized water three times, and concentrated by using a rotary evaporator to obtain 96.8 g of silsesquioxane compound 2 (hereinafter abbreviated to SP55) solution.

From measurement of volatile matter at 100° C., the content of SP55 in the obtained solution was 53.9% by mass. The weight average molecular weight Mw in terms of polystyrene measured by GPC of the obtained compound was 4,000, and the dispersity Mw/Mn was 1.8.

[Example 1] Preparation of Polymerizable Composition 1

15 parts by mass of AP10 as (a) a silsesquioxane compound, 85 parts by mass of FDA as (b) a fluorene compound, 0.5 parts by mass of DDDS as (d) a chain transfer agent (reaction promoter), 0.5 parts by mass of I1010 as (e) an antioxidant, and 2 parts by mass of I184 and 1 part by mass of TPO as a polymerization initiator were stirred and mixed at 50° C. for 1 hour. The mixture was stirred and defoamed for 10 minutes, to prepare a polymerizable composition 1.

[Examples 2 and 3] Preparation of Polymerizable Compositions 2 and 3

Polymerizable compositions 2 and 3 were prepared by the same operation as in Example 1 except that each composition was changed as listed in Table 1. Herein, "part(s)" in Table 1 refers to "part(s) by mass."

[Examples 4 and 5 and Comparative Example 1] Preparation of Polymerizable Compositions 4 to 6

Polymerizable compositions 4 to 6 were prepared by the same operation as in Example 1 except that BnA was added as (c) another (meth)acrylate compound and each composition was changed as listed in Table 1. In a case of the polymerizable compositions 4 and 5, the components (a) and (c) were mixed, the solvent contained in the component (a) was distilled off, and the remaining component was added.

TABLE 1

| EXAMPLES/ COMPARATIVE EXAMPLE | POLYMERIZABLE COMPOSITION | (a) SILSES- QUIO- XANE | [PART] | (b) FDA [PART] | (c) BnA [PART] | (d) CHAIN TRANS- FER AGENT | [PART] | (e) I1010 [PART] | I184 [PART] | TPO [PART] |
|---|---|---|---|---|---|---|---|---|---|---|
| EXAMPLE 1 | POLYMERIZABLE COMPOSITION 1 | AP10 | 15 | 85 | — | DDDS | 0.5 | 0.5 | 2 | 1 |
| EXAMPLE 2 | POLYMERIZABLE COMPOSITION 2 | AP10 | 25 | 75 | — | DDDS | 0.5 | 0.5 | 2 | 1 |
| EXAMPLE 3 | POLYMERIZABLE COMPOSITION 3 | AP10 | 35 | 65 | — | DDDS | 0.5 | 0.5 | 2 | 1 |
| EXAMPLE 4 | POLYMERIZABLE COMPOSITION 4 | AP55 | 42.5 | 42.5 | 15 | DDT | 0.5 | 0.5 | 2 | 0.5 |
| EXAMPLE 5 | POLYMERIZABLE COMPOSITION 6 | APe55 | 45 | 45 | 10 | DDT | 0.5 | 0.5 | 2 | 0.5 |
| COMPARATIVE EXAMPLE 1 | POLYMERIZABLE COMPOSITION 5 | SP55 | 42.5 | 42.5 | 15 | DDDS | 0.5 | 0.5 | 2 | 0.5 |

[Evaluation of Optical Characteristics]

To a glass substrate subjected to an easy adhesion treatment with MPTMS in advance, Kapton (registered trademark) tape with a thickness of 50 μm was bonded as a spacer. Each of the polymerizable compositions was placed on the glass substrate, and covered with an untreated glass substrate to interpose the polymerizable composition between the glass substrate and the untreated glass substrate. The interposed polymerizable composition was exposed to UV at 20 mW/cm² for 150 seconds, and heated by an oven of 150° C. for 20 minutes, to prepare a cured product. The cured product was cooled to room temperature (about 23° C.), and the untreated glass substrate in which the polymerizable composition is interposed was peeled. The refractive index of the obtained cured product at 633 nm was measured. The results are shown in Table 2.

Kyodo International, Inc., lens size: 40 μm in diameter×16.5 μm in depth) on a glass substrate as a support with a nanoimprinter. The mold was taken out, and the polymerizable composition was heated by a hot plate of 150° C. for 15 minutes, and then heated by a hot plate of 265° C. for 3 minutes, to prepare a convex lens on the glass substrate.

The lens height (thickness) of any three convex lenses on the obtained glass substrate was measured before and after a heating test by an oven (150° C., 500 hours (in the polymerizable composition 4, 125° C. and 96 hours; in the polymerizable composition 6, 150° C. and 96 hours). From a change ratio (=(lens height before heating−lens height after heating)/lens height before heating×100), the dimensional stability under heating was evaluated. The results are shown in Table 2.

TABLE 2

| EXAMPLES/ COMPARATIVE EXAMPLE | POLYMERIZABLE COMPOSITION | REFRAC- TIVE INDEX | LIGHT (400 nm) TRANSMITTANCE | | | | LENS HEIGHT [μm] | | |
|---|---|---|---|---|---|---|---|---|---|
| | | | BEFORE HEATING | AFTER 24 HOURS | AFTER 96 HOURS | AFTER 500 HOURS | BEFORE HEATING | AFTER HEATING | CHANGE RATIO |
| EXAMPLE 1 | POLYMERIZABLE COMPOSITION 1 | 1.591 | 96.6 | 96.9 | NOT MEASURED | 96.5 | 16.684 | 16.605 | −0.5% |
| EXAMPLE 2 | POLYMERIZABLE COMPOSITION 2 | 1.580 | 96.0 | 97.1 | NOT MEASURED | 95.9 | 16.109 | 16.084 | −0.2% |
| EXAMPLE 3 | POLYMERIZABLE COMPOSITION 3 | 1.570 | 96.7 | 97.0 | NOT MEASURED | 95.5 | 16.553 | 16.535 | −0.1% |
| EXAMPLE 4 | POLYMERIZABLE COMPOSITION 4 | 1.571 | 97.8 | 97.6 | 97.7 | NOT MEASURED | 16.381 | 16.323 | −0.4% |
| EXAMPLE 5 | POLYMERIZABLE COMPOSITION 6 | 1.606 | 97.5 | NOT MEASURED | 97.5 | NOT MEASURED | 16.481 | 16.417 | −0.4% |
| COMPARATIVE EXAMPLE 1 | POLYMERIZABLE COMPOSITION 5 | 1.593 | 96.7 | 93.8 | NOT MEASURED | NOT MEASURED | NOT MEASURED | NOT MEASURED | — |

[Evaluation of Heat-Resistant Transparency]

The light transmittance of each of the cured products obtained above at a wavelength of 400 nm was measured before and after a heating test by an oven (125° C. and 24 hours and 500 hours (in the polymerizable composition 4, 150° C. and 24 hours and 96 hours)). A decrease in light transmittance under heating was evaluated. The results are shown in Table 2.

[Evaluation of Dimensional Stability]

Each of the polymerizable compositions was molded using a micro lens-shaped silicone mold (manufactured by As a result, in the cured product obtained from the polymerizable composition of the present invention, a decrease in light transmittance at 400 nm of the cured product was as low as 1% or less even after heating at 125 to 150° C. for 96 hours or more, and the cured product was very slightly discolored (yellowed) by heating as shown in Table 2. In contrast, in the cured product in which a silsesquioxane compound having a vinylphenyl group was added, the light transmittance was decreased by heating at 125° C. for 24 hours by about 3%, and the coloration was visually confirmed.

In the cured product (convex lens) obtained from the polymerizable composition of the present invention, a result including a very small change in lens height even after heating at 125 to 150° C. for a long time of 96 hours or more and high dimensional stability under heating was obtained.

The invention claimed is:

1. A polymerizable composition comprising:
    (a) 100 parts by mass of reactive silsesquioxane compound as a polycondensate of an alkoxy silicon compound A of Formula [1] with an alkoxy silicon compound B of Formula [2] in an amount by mole of 0 to 99 times the amount of the alkoxy silicon compound:

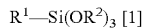

where $R^1$ is a $C_{1-10}$ alkyl group having at least one (meth)acryloyloxy group and $R^2$ is a methyl group or an ethyl group,

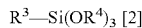

where $R^3$ is a $C_{1-10}$ alkyl group, a $C_{7-10}$ aralkyl group, or a $C_{6-14}$ aryl group and $R^4$ is a methyl group or an ethyl group;
    (b) 10 to 2,000 parts by mass of fluorene compound of Formula [3]:

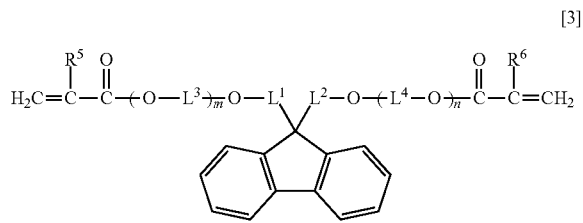

where $R^5$ and $R^6$ are each independently a hydrogen atom or a methyl group, $L^1$ and $L^2$ are each independently a phenylene group optionally having a substituent or a naphthalenediyl group optionally having a substituent, $L^3$ and $L^4$ are each independently a $C_{1-6}$ alkylene group, and m and n are 0 or a positive integer with m+n satisfying 0 to 40; and
    (c) a chain transfer agent in an amount of 0.01 to 10 parts by mass relative to 100 parts by mass of the total amount of the components (a) and (b).

2. The polymerizable composition according to claim 1, wherein $R^3$ is a $C_{6-14}$ aryl group.

3. The polymerizable composition according to claim 1, further comprising (d) a (meth)acrylate compound different from the fluorene compound in an amount of 1 to 200 parts by mass relative to 100 parts by mass of the total amount of the components (a) (b), and
    the component (c) is included in an amount of 0.01 to 10 parts by mass relative to 100 parts by mass of the total amount of the components (a), (b) and (d).

4. The polymerizable composition according to claim 1, further comprising (e) an antioxidant in an amount of 0.01 to 20 parts by mass relative to 100 parts by mass of the total amount of the components (a) and (b).

5. A cured product obtained by curing of the polymerizable composition according to claim 1.

6. A material for a resin lens comprising the polymerizable composition according to claim 1.

7. A resin lens manufactured from the polymerizable composition according to claim 1.

8. The resin lens according to claim 7, which is a lens for a CMOS image sensor.

9. A method for manufacturing a molded body comprising steps of filling a space between a support and a mold in contact with the support or a space in a splittable mold with the polymerizable composition according to claim 1, and exposing the filled polymerizable composition to light, resulting in photopolymerization.

10. The method according to claim 9, further comprising steps of taking out the photopolymerized product from the filled space to release the product from the mold, and heating the photopolymerized product before, during, or after releasing the photopolymerized product from the mold.

11. The method according to claim 9, wherein the molded body is a resin lens.

12. The polymerizable composition according to claim 3, further comprising (e) an antioxidant in an amount of 0.01 to 20 parts by mass relative to 100 parts by mass of the total amount of the components (a), (b) and (d).

* * * * *